United States Patent
Wu et al.

(10) Patent No.: US 8,938,659 B2
(45) Date of Patent: Jan. 20, 2015

(54) LOW-DENSITY PARITY-CHECK DECODER DISPARITY PREPROCESSING

(71) Applicant: LSI Corporation, San Jose, CA (US)

(72) Inventors: YingQuan Wu, Milpitas, CA (US); Earl T. Cohen, Milpitas, CA (US)

(*) Notice: Subject to any disclaimer, the term of this patent is extended or adjusted under 35 U.S.C. 154(b) by 86 days.

(21) Appl. No.: 13/753,987

(22) Filed: Jan. 30, 2013

(65) Prior Publication Data
US 2013/0297988 A1    Nov. 7, 2013

Related U.S. Application Data

(63) Continuation-in-part of application No. 13/464,433, filed on May 4, 2012.

(51) Int. Cl.
| G11C 29/00 | (2006.01) |
| G06F 11/10 | (2006.01) |
| G06F 12/00 | (2006.01) |
| H03M 13/11 | (2006.01) |

(52) U.S. Cl.
CPC ........... G06F 11/1068 (2013.01); G06F 12/00 (2013.01); G06F 11/1048 (2013.01); H03M 13/1102 (2013.01)
USPC .............. 714/773; 714/6.1; 714/48; 714/721; 714/47.2

(58) Field of Classification Search
CPC ..... G06F 12/00; G06F 2212/72; G06F 11/10; G06F 11/1052; G06F 11/1068; H03M 13/1102
USPC ............................ 714/773, 6.1, 48, 721, 47.2
See application file for complete search history.

(56) References Cited

U.S. PATENT DOCUMENTS

| 7,607,065 | B2 | 10/2009 | Bickerstaff et al. | |
| 8,321,752 | B1 | 11/2012 | Yang et al. | |
| 8,341,487 | B2 | 12/2012 | Blanksby et al. | |
| 8,539,311 | B2* | 9/2013 | Steiner et al. | 714/764 |
| 8,732,538 | B2* | 5/2014 | Krishnamoorthy | 714/722 |
| 2009/0269081 | A1* | 10/2009 | Cai et al. | 398/202 |
| 2011/0047422 | A1* | 2/2011 | Aritome | 714/718 |
| 2011/0182119 | A1* | 7/2011 | Strasser et al. | 365/185.03 |
| 2012/0185744 | A1 | 7/2012 | Varnica et al. | |
| 2013/0297986 | A1* | 11/2013 | Cohen | 714/763 |

OTHER PUBLICATIONS

Y. Cassuto, M. Schwartz, V. Bohossian, J. Bruck, "Codes for Asymmetric Limited-Magnitude Errors with Application to Multilevel Flash Memories," IEEE Transactions on Information Theory, vol. 56, No. 4, pp. 1582-1595, Apr. 2010 (USA).

X. Zhang, F. Cai, C. Shi, "Low-Power LDPC Decoding Based on Iteration Prediction," 2012 IEEE International Symposium on Circuits and Systems (ISCAS), pp. 3041-3044, May 2012 (USA).

* cited by examiner

Primary Examiner — John Trimmings

(57) ABSTRACT

Described embodiments provide a media controller that performs error correction on data read from a solid-state media. The media controller receives a read operation from a host device to read one or more given read units of the solid-state media. The media controller reads the data for the corresponding read units from the solid-state media employing initial values for one or more read threshold voltages. Only if a disparity between an actual number of bits at a given logic level included in the read data and an expected number of bits at the given logic level included in the read data has not reached a predetermined threshold, the media controller decodes the read data and provides the decoded data to the host device.

20 Claims, 5 Drawing Sheets

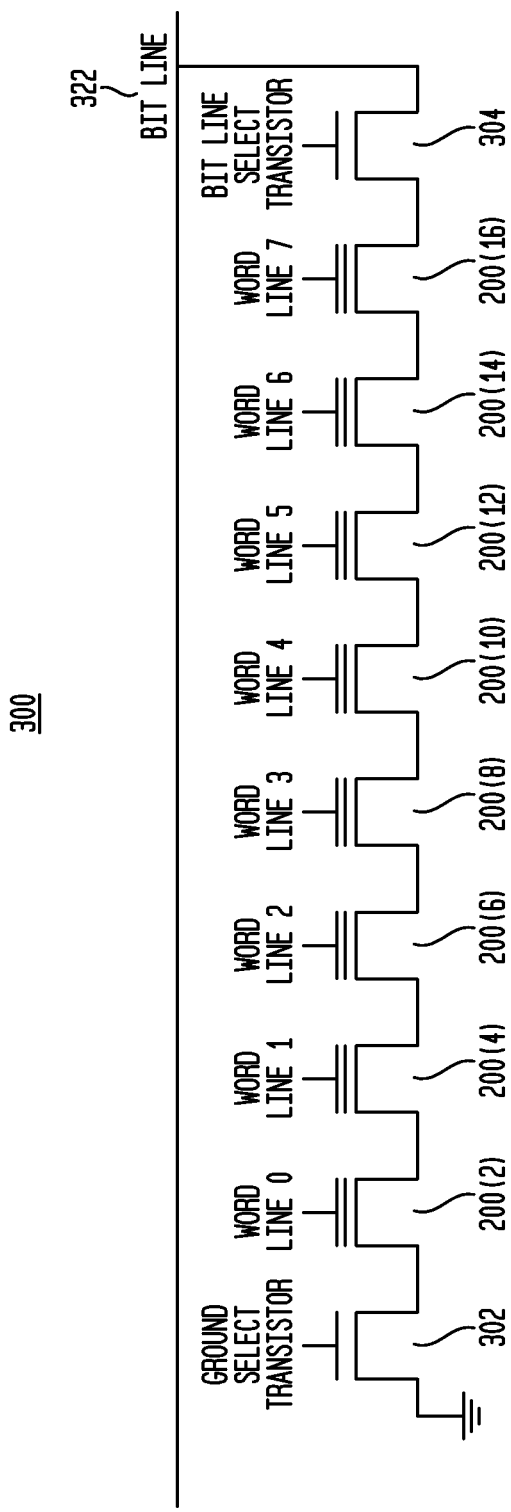

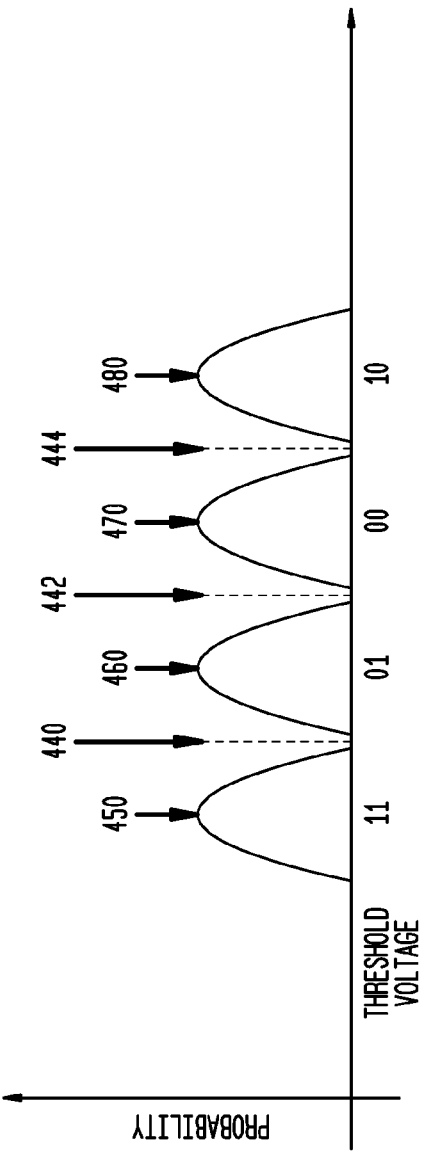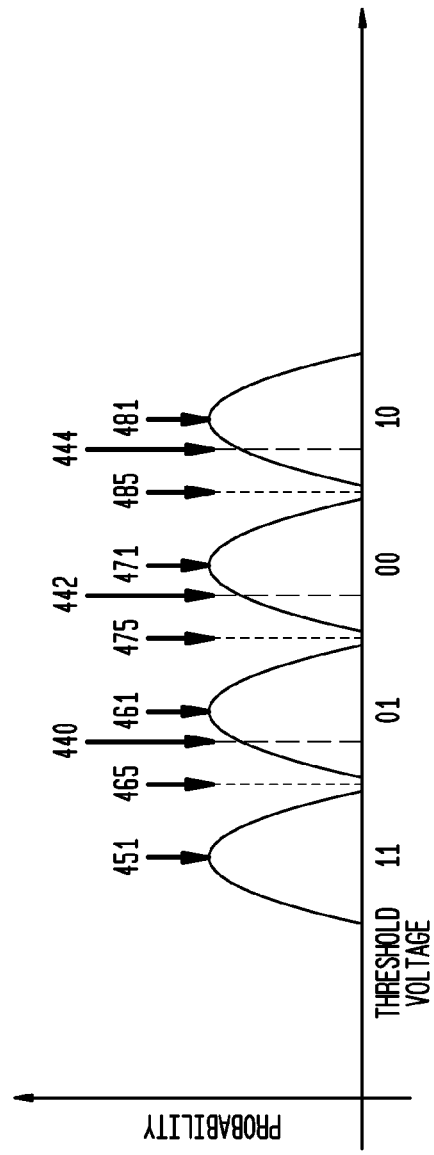

LOW-DENSITY PARITY-CHECK DECODER DISPARITY PREPROCESSING

CROSS-REFERENCE TO RELATED APPLICATIONS

This application is a continuation-in-part, and claims the benefit of the filing date, of U.S. patent application Ser. No. 13/464,433 filed May 4, 2012, the teachings of which are incorporated herein in their entireties by reference.

BACKGROUND

Flash memory is a non-volatile memory (NVM) that is a specific type of electrically erasable programmable read-only memory (EEPROM). One commonly employed type of flash memory technology is NAND flash memory. NAND flash memory requires small chip area per cell and is typically divided into one or more banks or planes. Each bank is divided into blocks; each block is divided into pages. Each page includes a number of bytes for storing user data, error correction code (ECC) information, or both.

There are three basic operations for NAND devices: read, write and erase. The read and write operations are performed on a page-by-page basis. Page sizes are generally $2^N$ bytes of user data (plus additional bytes for ECC information), where N is an integer, with typical user data page sizes of, for example, 2,048 bytes (2 KB), 4,096 bytes (4 KB), 8,192 bytes (8 KB) or more per page. A "read unit" is the smallest amount of data and corresponding ECC information that can be read from the NVM and corrected by the ECC, and might typically be between 4K bits and 32K bits (e.g., there is generally an integer number of read units per page). Pages are typically arranged in blocks, and an erase operation is performed on a block-by-block basis. Typical block sizes are, for example, 64, 128 or more pages per block. Pages must be written sequentially, usually from a low address to a high address within a block. Lower addresses cannot be rewritten until the block is erased. Associated with each page is a spare area (typically 100-640 bytes) generally used for storage of ECC information and/or other metadata used for memory management. The ECC information is generally employed to detect and correct errors in the user data stored in the page, and the metadata might be used for mapping logical addresses to and from physical addresses. In NAND flash chips with multiple banks, multi-bank operations might be supported that allow pages from each bank to be accessed substantially in parallel.

NAND flash memory stores information in an array of memory cells made from floating gate transistors. These transistors hold their voltage level, also referred to as charge, for long periods of time, on the order of months or years, without external power being supplied. In single-level cell (SLC) flash memory, each cell stores one bit of information. In multi-level cell (MLC) flash memory, each cell can store more than one bit per cell by choosing between multiple levels of electrical charge to apply to the floating gates of its cells. MLC NAND flash memory employs multiple voltage levels per cell with a serially linked transistor arrangement to allow more bits to be stored using the same number of transistors. Thus, considered individually, each cell has a particular stored (programmed) charge that corresponds to the logical bit value(s) being stored in the cell, and the cells are read based on one or more threshold voltages for each cell.

While, ideally, all cells in the NVM would have the same threshold voltages, in practice the threshold voltages differ across the cells in "threshold voltage distributions" that are similar in shape to a Gaussian probability curve. Considered across a large number of cells (e.g., a read unit or a page), there are as many threshold voltage distributions (e.g., Gaussian probability curves) as there are states per cell (e.g., $2^b$ distributions per cell, where b is the number of bits). Thus, for SLC flash memories, there are two states (0 or 1) and thus two threshold voltage distributions (one for zeroes and another for ones) per cell, and a single read threshold voltage. Most MLC NAND flash memories employs four possible states per cell, and can thus store two bits of information per cell. Thus, for MLC flash memories, there are four states (e.g., 00, 01, 10, 11) and thus four threshold voltage distributions and three read thresholds.

Increasing the number of bits per cell causes cell-to-cell interference and retention noise (e.g., a drift in the stored charge, such as due to leakage) to become more severe, which reduces the amount of voltage margin separating each voltage level and increases the likelihood of read errors and, thus, the bit error ratio (BER) of the system. Further, the threshold voltage distributions of each cell can change over operating time of the NVM, for example due to read disturb, write disturb, retention loss, cell aging and process, voltage and temperature (PVT) variations, also increasing the BER. When a bit error is encountered in a read unit read from NVM, the NVM might re-read the read unit at different voltage values of the read threshold to attempt to locate a sample of the read unit that is hard-decoding correctable. Further, software complexity might be increased to compensate for a larger BER, for example by employing an error correction code (ECC) such as Bose-Chaudhuri-Hocquenghem (BCH) and Low-Density Parity-Check (LDPC).

As memory devices become smaller and the number of levels per cell increases, more powerful ECC is required. For example, ECC is improved by decreasing the code rate for BCH codes, however, decreasing the code rate reduces the storage capacity of the NVM. Unlike BCH codes, LDPC codes allow soft-decision decoding, where in addition to estimating each bit value ("hard decoding"), the decoder also estimates each bit's reliability ("soft-decision decoding"). For LDPC codes to outperform BCH codes, improved estimation of each bit's reliability is desired.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Described embodiments provide a media controller that performs error correction on data read from a solid-state media. The media controller receives a read operation from a host device to read one or more given read units of the solid-state media. The media controller reads the data for the corresponding read units from the solid-state media employing initial values for one or more read threshold voltages. Only if a disparity between an actual number of bits at a given logic level included in the read data and an expected number of bits at the given logic level included in the read data has not reached a predetermined threshold, the media controller decodes the read data and provides the decoded data to the host device.

BRIEF DESCRIPTION OF THE DRAWING FIGURES

Other aspects, features, and advantages of described embodiments will become more fully apparent from the following detailed description, the appended claims, and the accompanying drawings in which like reference numerals identify similar or identical elements.

FIG. 3 shows an exemplary NAND MLC flash memory cell in accordance with exemplary embodiments;

FIG. 4A shows an exemplary diagram of the threshold voltage probability distributions of the MLC NAND clash cell of FIG. 3 at an initial time;

FIG. 4B shows an exemplary diagram of shifted threshold voltage probability distributions of the MLC NAND clash cell of FIG. 3 at a later time.

DETAILED DESCRIPTION

Described embodiments provide a media controller that performs error correction on data read from a solid-state media. The media controller receives a read operation from a host device to read one or more given read units of the solid-state media. The media controller reads the data for the corresponding read units from the solid-state media employing initial values for one or more read threshold voltages. Only if a disparity between an actual number of bits at a given logic level included in the read data and an expected number of bits at the given logic level included in the read data has not reached a predetermined threshold, the media controller decodes the read data and provides the decoded data to the host device.

Table 1 defines a list of acronyms employed throughout this specification as an aid to understanding the described embodiments:

TABLE 1

| BCH | Bose-Chaudhuri-Hocquenghem | BER | Bit Error Rate |
|---|---|---|---|
| ECC | Error Correction Code | eDRAM | Embedded Dynamic Random Access Memory |
| EEPROM | Electrically Erasable Programmable Read-Only Memory | IC | Integrated Circuit |
| I/O | Input/Output | LDPC | Low-Density Parity-Check |
| LLR | Log-Likelihood Ratio | LSB | Least Significant Bit |
| MLC | Multi-Level Cell | MSB | Most Significant Bit |
| NVM | Non-Volatile Memory | PCI-E | Peripheral Component Interconnect Express |
| P/E | Program/Erase | PVT | Process, Voltage, Temperature |
| SAS | Serial Attached SCSI | SATA | Serial Advanced Technology Attachment |
| SCSI | Small Computer System Interface | SoC | System on Chip |
| SLC | Single Level Cell | SRAM | Static Random Access Memory |
| SRIO | Serial Rapid Input/Output | SSD | Solid-State Disk |
| USB | Universal Serial Bus | | |

Figure 1:
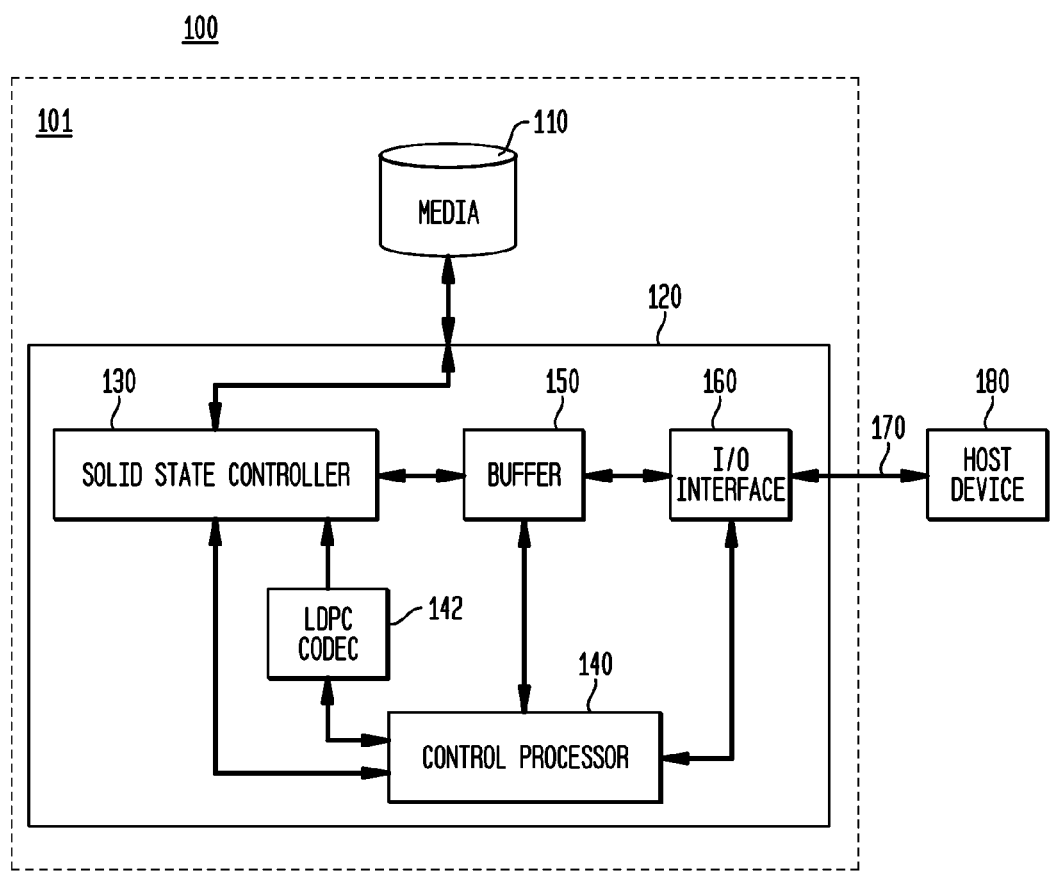
FIG. 1 shows a block diagram of a flash memory storage system in accordance with exemplary embodiments.

FIG. 1 shows a block diagram of non-volatile memory (NVM) storage system 100. NVM storage system 100 includes media 110, which is coupled to media controller 120. Media 110 might be implemented as a NAND flash solid-state disk (SSD), a magnetic storage media such as a hard disk drive (HDD), or as a hybrid solid-state and magnetic system. As shown in FIG. 1, media 110 and media controller 120 are collectively SSD 101. Media controller 120 includes solid state controller 130, control processor 140, buffer 150 and I/O interface 160. Media controller 120 controls transfer of data between media 110 and host device 180 that is coupled to communication link 170. Media controller 120 might be implemented as a system-on-chip (SoC) or other integrated circuit (IC). Solid state controller 130 might be used to access memory locations in media 110, and might typically implement low-level, device specific operations to interface with media 110. Buffer 150 might be a RAM buffer employed to act as a cache for control processor 140 and/or as a read/write buffer for operations between solid state media 110 and host device 180. For example, data might generally be temporarily stored in buffer 150 during transfer between solid state media 110 and host device 180 via I/O interface 160 and link 170. Buffer 150 might be employed to group or split data to account for differences between a data transfer size of communication link 170 and a storage unit size (e.g., read unit size, page size, sector size, or mapped unit size) of media 110. Buffer 150 might be implemented as a static random-access memory (SRAM) or as an embedded dynamic random-access memory (eDRAM) internal to media controller 120, although buffer 150 could also include memory external to media controller 120 (not shown), which might typically be implemented as a double-data-rate (e.g., DDR-3) DRAM.

Control processor 140 communicates with solid state controller 130 to control data access (e.g., read or write operations) data in media 110. Control processor 140 might be implemented as one or more Pentium®, Power PC®, Tensilica® or ARM processors, or a combination of different processor types (Pentium® is a registered trademark of Intel Corporation, Tensilica® is a trademark of Tensilica, Inc., ARM processors are by ARM Holdings, plc, and Power PC® is a registered trademark of IBM). Although shown in FIG. 1 as a single processor, control processor 140 might be implemented by multiple processors (not shown) and include software/firmware as needed for operation, including to perform threshold optimized operations in accordance with described embodiments. Control processor 140 is in communication with low-density parity-check (LDPC) coder/decoder (codec) 142, which performs LDPC encoding for data written to media 110 and decoding for data read from media 110.

Communication link 170 is used to communicate with host device 180, which might be a computer system that interfaces with NVM system 100. Communication link 170 might be a custom communication link, or might be a bus that operates in accordance with a standard communication protocol such as, for example, a Small Computer System Interface ("SCSI") protocol bus, a Serial Attached SCSI ("SAS") protocol bus, a Serial Advanced Technology Attachment ("SATA") protocol bus, a Universal Serial Bus ("USB"), an Ethernet link, an IEEE 802.11 link, an IEEE 802.15 link, an IEEE 802.16 link, a Peripheral Component Interconnect Express ("PCI-E") link, a Serial Rapid I/O ("SRIO") link, or any other similar interface link for connecting a peripheral device to a computer.

Figure 2:
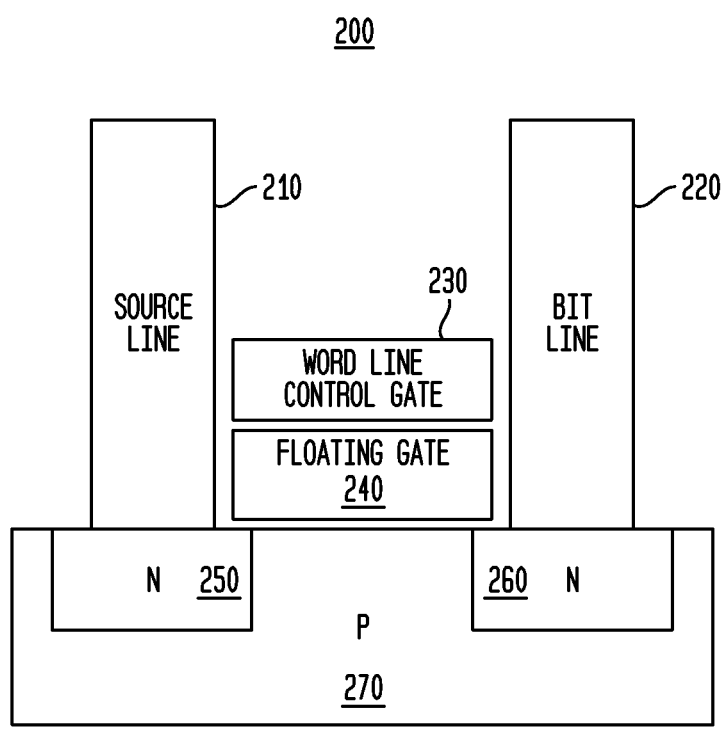
FIG. 2 shows an exemplary functional block diagram of a single standard flash memory cell.

FIG. 2 shows an exemplary functional block diagram of a single flash memory cell that might be found in solid state media 110. Flash memory cell 200 is a MOSFET with two gates. The word line control gate 230 is located on top of floating gate 240. Floating gate 240 is isolated by an insulating layer from word line control gate 230 and the MOSFET channel, which includes N-channels 250 and 260, and P-channel 270. Because floating gate 240 is electrically isolated, any charge placed on floating gate 240 will remain and will not discharge significantly, typically for many months.

When floating gate 240 holds a charge, it partially cancels the electrical field from word line control gate 230 that modifies the threshold voltage of the cell. The threshold voltage is the amount of voltage applied to control gate 230 to allow the channel to conduct. The channel's conductivity determines the value stored in the cell, for example by sensing the charge on floating gate 240.

FIG. 3 shows an exemplary NAND MLC flash memory string 300 that might be found in solid state media 110. As shown in FIG. 3, flash memory string 300 might include one or more word line transistors 200(2), 200(4), 200(6), 200(8), 200(10), 200(12), 200(14), and 200(16) (e.g., 8 flash memory cells), and bit line select transistor 304 connected in series, drain to source. This series connection is such that ground select transistor 302, word line transistors 200(2), 200(4), 200(6), 200(8), 200(10), 200(12), 200(14) and 200(16), and bit line select transistor 304 are all "turned on" (e.g., in either a linear mode or a saturation mode) by driving the corresponding gate high in order for bit line 322 to be pulled fully low. Varying the number of word line transistors 200(2), 200(4), 200(6), 200(8), 200(10), 200(12), 200(14), and 200(16), that are turned on (or where the transistors are operating in the linear or saturation regions) might enable MLC string 300 to achieve multiple voltage levels. A typical MLC NAND flash might employ a "NAND string" (e.g., as shown in FIG. 3) of 64 transistors with floating gates. During a write operation, a high voltage is applied to the NAND string in the word-line position to be written. During a read operation, a voltage is applied to the gates of all transistors in the NAND string except a transistor corresponding to a desired read location. The desired read location has a floating gate.

As described herein, in both SLC and MLC NAND flash, each cell has a voltage charge level (e.g., an analog signal) that can be sensed, such as by comparison with a read threshold voltage level. A media controller might have a given number of predetermined voltage thresholds employed to read the voltage charge level and detect a corresponding binary value of the cell. For example, for MLC NAND flash, if there are 3 thresholds (0.1, 0.2, 0.3), when a cell voltage level is 0.0≤cell voltage <0.1, the cell might be detected as having a value of [00]. If the cell voltage level is 0.1≤cell voltage <0.2, the value might be [10], and so on. Thus, a measured cell level might typically be compared to the thresholds one by one, until the cell level is determined to be in between two thresholds and can be detected. Thus, detected data values are provided to a decoder of memory controller 120 to decode the detected values (e.g., with an error-correction code) into data to be provided to host device 180.

Described embodiments employ Low-Density Parity-Check (LDPC) decoders to decode data stored in the flash memory (e.g., LDPC codec 142 of FIG. 1). LDPC decoders can approach the Shannon limit in terms of correction ability. Unlike algebraic codes, though, LDPC codes do not have a fixed correction ability (such as in bits of errors correctable per codeword). However, to more efficiently employ LDPC codes, "soft" data such as the analog-like probability that each bit being decoded has a given value, or the precise charge level of the cells, can be employed. The probability of a decoded bit having a given value is generally specified as a Log-Likelihood Ratio (LLR). In MLC NAND flash memories, for example, the ability to move the threshold voltage for bit detection during read operations enables taking multiple samples of the bit values to determine how reliable each bit is, and this reliability can then be expressed as an LLR for each bit. As described herein, a part of soft-decision LDPC decoding of NAND flash memory is turning one or more reads of the NAND flash (each at a different threshold voltage) into an LLR for each bit position.

FIGS. 4A and 4B show exemplary diagrams of the threshold voltages and threshold voltage probability distributions of an MLC NAND flash cell such as shown in FIG. 3. FIG. 4A represents the threshold voltage probability distributions at an initial time (e.g., when the data is written) for Gray coded MLC states 11 (e.g., distribution 450), 01 (e.g., distribution 460), 00 (e.g., distribution 470), and 10 (e.g., distribution 480). As shown, nominal read thresholds 440, 442 and 444 are ideally located between each MLC state. FIG. 4B represents the threshold voltage probability distributions at a later time. As shown in FIG. 4B, threshold voltage distributions 451, 461, 471, and 481 are shifted, such as by retention drift, with respect to their earlier respective threshold voltage distributions 450, 460, 470, and 480 shown in FIG. 4A. Although FIG. 4B shows all four distributions uniformly shifted to the left, in practice, the distributions generally might shift independently of each other. Further, the direction of the shifts in the threshold voltage distributions are not generally known or directly knowable. Still further, the shift might be independent in each bit, the shift may also cause the distributions to widen, and the widening may be asymmetrical.

In some embodiments, various scrambling techniques are used such that the statistical distribution of the four states is 25 percent for each state. When the MLC cell having shifted distributions (e.g., such as shown in FIG. 4B) is read using the nominal read thresholds (e.g., 440, 442 and 444, which are situated for the non-shifted distribution locations shown in FIG. 4A), then a deviation from the expected read data of 25 percent for each state (over many samples) might be observed (e.g., prior to any error correction). Media controller 120 might employ this disparity in the read data states to infer the existence of shifts in the threshold voltage distributions. Media controller 120 might then adjust the nominal read thresholds (e.g., 440, 442 and 444) based at least in part on the observed disparity to become shifted read thresholds 465, 475 and 485 as shown in FIG. 4B. In some embodiments, disparities might be evaluated on an entire page basis (or multiple page basis). In other embodiments, disparities might be evaluated on a read unit and/or codeword basis. Although not shown in FIGS. 4A and 4B, for SLC cells, there might be two states (e.g., 1 and 0) and a single read threshold. Scrambling might be employed such that the statistical distribution of the two states is 50 percent for each state. Read thresholds might typically be shifted as described in related U.S. patent application Ser. No. 13/464,433 filed May 4, 2012, incorporated herein by reference.

As described herein, when reading a typical MLC flash, three read thresholds are originally set to default values programmed by the flash manufacturer. If ECC is unsuccessful, the three thresholds are modified to re-read the data. Described embodiments employ disparities between read data and expected read data to perform preprocessing to detect extraordinary flash behavior such as over-programming (where cells are programmed with a voltage exceeding the cell's maximum voltage, and a programmed state is mistaken for a higher state) and retention errors (where cells lose charge and a programmed state is mistaken for a lower state).

Described embodiments apply (e.g., by LDPC codec 142 and/or by an associated scrambler, such as AES encryption engine) an LBA-seeded random scrambling algorithm to user data for write operations to SSD 101 such as described in related U.S. patent application Ser. No. 13/464,433 filed May 4, 2012, which is incorporated herein by reference. LDPC encoding involves generating the product of the scrambled user data and a dense generator matrix of the LDPC encoder. Therefore, each bit of each entire codeword can be treated as having equal probability of being a 0 or a 1 (e.g., a 50/50 percent statistical distribution of zero bits and one bits). The statistical distribution being 50/50 percent does not mean that any one sample of data would have an exactly even balance of zero bits and one bits, but rather that an average over many samples produces a ratio of zero bits and one bits that converges on 50/50 percent with an increasingly tight probabilistic bound as a number of the samples increases, generating a Gaussian distribution with a variance that is approximated by n/4 where n is the number of samples. For example, if there are 18,432 bits in a read unit (e.g., one LDPC codeword) with a 50/50 percent statistical distribution of zero bits and one bits, the variance in the number of zero bits (or one bits) is approximately 4,608 and the standard deviation is approximately 68. With a standard deviation of 68, less than 1 in one million samples of read units would be expected to have a number of one bits more than 340 (5 standard deviations) away from the average of 9,216.

When the NVM, after having been written with the scrambled and encoded user data, is read using ideal read thresholds (e.g., directly in the center of evenly distributed, symmetric charge states) the observed read data statistical distribution of zeroes and ones is likewise 50/50 percent. Accordingly, as in the example above, less than 1 in one million read units would exhibit either less than 9216−340=8876 one bits or more than 9216+340=9556 one bits. Therefore, if more than, for example, 9556 one bits are counted in a given read unit, it can be assumed that retention (or other) errors have occurred and LDPC correction might not be adequate to recover the correct data without shifting the read threshold voltage(s). Similarly, if, for example, fewer than 8876 one bits are counted in a given read unit, it can be assumed that over-programming (or other) errors have occurred and LDPC correction again might not be adequate to recover the correct data without shifting the read threshold voltage(s). In alternative embodiments, the number of zero bits or the disparity between the number of one bits and the number of zero bits might be counted instead of, or in addition to, the number of one bits. In various embodiments, if the number of one bits (or the number of zero bits, or the disparity between the number of one bits and the number of zero bits) exceeds a specified threshold, LDPC correction is not performed (e.g., skipped) in favor of performing a second read with different threshold voltage(s). According to various embodiments, the probabilistic bound beyond which LDPC decoding is skipped is selected according to one or more of: a determined number of standard deviations of the number of one (or zero) bits; a probability of LDPC correction failing; a probability of LDPC correction miscorrecting; a specified uncorrectable bit error rate target; a known, estimated, or measured raw bit error rate; and other factors.

The consequences of determining based on the number of one bits (or equivalently the number of zero bits or the disparity between the number of one bits and the number of zero bits) exceeding the specified threshold that the LDPC decoding should be skipped in favor of performing the second read include doing an extra read that might not have been required, and accordingly the specified threshold is selected according to a cost of LDPC decoding (with a chance of failure, including miscorrection) and a cost of doing the second read.

Upon reading a read unit (in codewords) from media 110, media controller 120 counts a number of 1's in the read unit. If the number of 1's in the read unit is above a predefined threshold (e.g., 54% of code length) or below another predefined threshold (e.g., 46% of code length), then LDPC decoding is aborted by media controller 120. In the ideal condition where the disparity is zero, the read unit contains exactly half 1's and half 0's. In an exemplary embodiment, thresholds of 0.54 and 0.46 are selected for determining whether LDPC correction is likely to fail (e.g., the number of 1's in the read sector data is more than 54% or less than 46%). Thus, codeword(s) that exhibit large disparity (e.g., more than 4% from nominal) are not decoded by LDPC codec 142 (e.g., LDPC decoding is bypassed or disabled), thus preventing miscorrections. Codeword(s) that exhibit large disparity (e.g., greater than 4%) enter retry mode to adjust the read thresholds and re-read the read unit data. Codeword(s) that do not exhibit large disparity (e.g., less than 4% from nominal) are decoded by LDPC codec 142 and the decoded data is provided to the host. Without enforcing disparity preprocessing, LDPC decoding might experience miscorrection due to highly distorted LLR information and large numbers of bit errors. Further, by not performing unnecessary LDPC decoding, power consumption of SSD 101 is reduced since counting 1's in sector data consumes negligible power.

Figure 5:
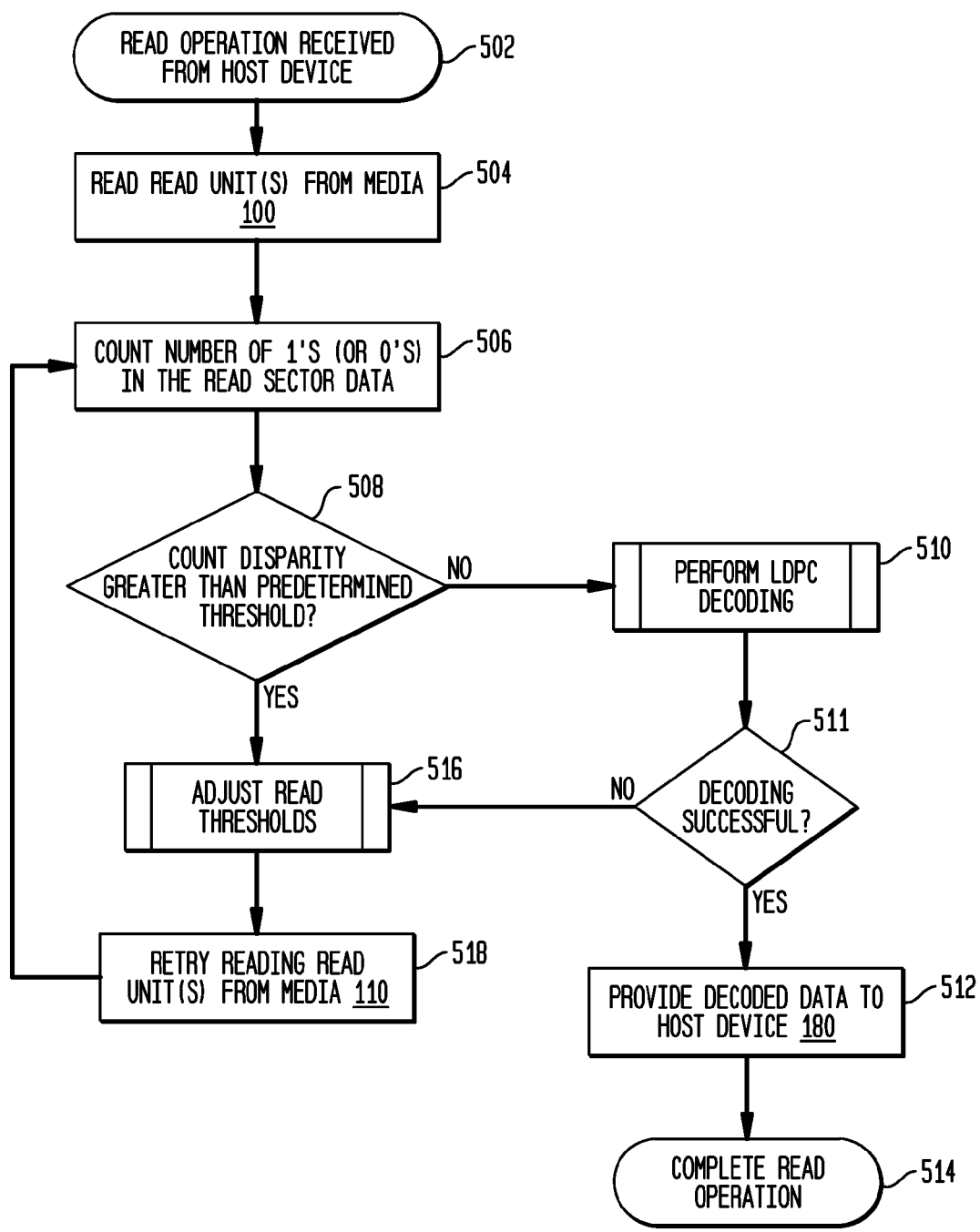
FIG. 5 shows a flow diagram of an exemplary LDPC disparity algorithm of the flash memory storage system of FIG. 1 in accordance with exemplary embodiments.

FIG. 5 shows a flow diagram of LDPC disparity algorithm 500. At step 502, a read operation is received by media controller 120 from host device 180. At step 504 the requested read unit(s) are read, in codewords, from media 110 to media controller 120 (e.g., buffer 150). At step 506, media controller 120 counts a number of 1's and/or 0's in the read unit data. In some embodiments, step 506 might be performed concurrently with step 504 as the data is read from media 110. At step 508, media controller 120 determines whether there is a disparity between the number of 1's and/or 0's counted for the read unit data and the expected number of 1's and/or 0's. If the determined disparity is greater than a predetermined threshold disparity (e.g., 4% from nominal as described herein), then process 500 continues to step 516. As described herein, if the number of counted 1's (or 0's) is greater than 54% of the total data, media controller 120 determines that retention (or other) errors have occurred and LDPC data correction would be inadequate to recover the correct data without shifting the read threshold voltage(s). Similarly, if the number of counted 1's is less than 46% of the total data, media controller 120 determines that over-programming (or other) errors have occurred and LDPC data correction would be inadequate to recover the correct data without shifting the read threshold voltage(s).

At step 516, the read threshold voltage(s) (e.g., an SLC NAND flash might employ a single read threshold voltage, while an MLC NAND flash employs multiple read threshold voltages) are adjusted based on the disparity between the counted number of 1's (or 0's) and the expected number of 1's or 0's. At step 518, media controller 120 enters a retry mode to re-read the sector data from media 110 with modified read threshold voltage(s) without performing LDPC decoding. In described embodiments, modifying the read thresholds might occur substantially as described in related U.S. patent application Ser. No. 13/464,433 filed May 4, 2012, incorporated herein by reference. Process 500 then returns to step 506 to count a number of 1's and/or 0's in the re-read data, and at step 508 it is again determined if there is a disparity between the number of 1's (or 0's) counted for the read unit data and the expected number of 1's (or 0's). Thus, in some embodiments, steps 506, 508, 516 and 518 might iteratively be repeated one or more times such that the read threshold(s) are adjusted more than one time and the read unit data is read more than one time in an attempt to read data from media 110. Thus, described embodiments reduce time spent and power consumed performing LDPC decoding on data that has a high disparity and would need adjusted read thresholds.

If, at step 508, the determined disparity is less than a predetermined threshold disparity (e.g., 4% from nominal as described herein), then process 500 continues to step 510. At step 510, LDPC codec 142 is enabled and decodes the read unit data. At step 511, it is determined whether the LDPC decoding successfully decoded the data. If, at step 511, the data is not successfully decoded, process 500 continues to step 516, where the read threshold voltage(s) are adjusted and, at step 518, the data is re-read. If, at step 511, the data is successfully decoded, process 500 continues to step 512, where media controller 120 provides the decoded read unit data to host device 180. At step 514, process 500 completes for the read operation received at step 502.

Thus, as described herein, described embodiments provide a media controller that performs error correction on data read from a solid-state media. The media controller receives a read operation from a host device to read one or more given read units of the solid-state media. The media controller reads the data for the corresponding read units from the solid-state media employing initial values for one or more read threshold voltages. Only if a disparity between an actual number of bits at a given logic level included in the read data and an expected number of bits at the given logic level included in the read data has not reached a predetermined threshold, the media controller decodes the read data and provides the decoded data to the host device.

Reference herein to "one embodiment" or "an embodiment" means that a particular feature, structure, or characteristic described in connection with the embodiment can be included in at least one embodiment. The appearances of the phrase "in one embodiment" in various places in the specification are not necessarily all referring to the same embodiment, nor are separate or alternative embodiments necessarily mutually exclusive of other embodiments. The same applies to the term "implementation."

As used in this application, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

While the exemplary embodiments have been described with respect to processing blocks in a software program, including possible implementation as a digital signal processor, micro-controller, or general-purpose computer, described embodiments are not so limited. As would be apparent to one skilled in the art, various functions of software might also be implemented as processes of circuits. Such circuits might be employed in, for example, a single integrated circuit, a multi-chip module, a single card, or a multi-card circuit pack.

Described embodiments might also be embodied in the form of methods and apparatuses for practicing those methods. Described embodiments might also be embodied in the form of program code embodied in non-transitory tangible media, such as magnetic recording media, optical recording media, solid state memory, floppy diskettes, CD-ROMs, hard drives, or any other non-transitory machine-readable storage medium, wherein, when the program code is loaded into and executed by a machine, such as a computer, the machine becomes an apparatus for practicing described embodiments. Described embodiments might can also be embodied in the form of program code, for example, whether stored in a non-transitory machine-readable storage medium, loaded into and/or executed by a machine, or transmitted over some transmission medium or carrier, such as over electrical wiring or cabling, through fiber optics, or via electromagnetic radiation, wherein, when the program code is loaded into and executed by a machine, such as a computer, the machine becomes an apparatus for practicing the described embodiments. When implemented on a general-purpose processor, the program code segments combine with the processor to provide a unique device that operates analogously to specific logic circuits. Described embodiments might also be embodied in the form of a bitstream or other sequence of signal values electrically or optically transmitted through a medium, stored magnetic-field variations in a magnetic recording medium, etc., generated using a method and/or an apparatus of the described embodiments.

It should be understood that the steps of the exemplary methods set forth herein are not necessarily required to be performed in the order described, and the order of the steps of such methods should be understood to be merely exemplary. Likewise, additional steps might be included in such methods, and certain steps might be omitted or combined, in methods consistent with various described embodiments.

As used herein in reference to an element and a standard, the term "compatible" means that the element communicates with other elements in a manner wholly or partially specified by the standard, and would be recognized by other elements as sufficiently capable of communicating with the other elements in the manner specified by the standard. The compatible element does not need to operate internally in a manner specified by the standard. Unless explicitly stated otherwise, each numerical value and range should be interpreted as being approximate as if the word "about" or "approximately" preceded the value of the value or range.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements. Signals and corresponding nodes or ports might be referred to by the same name and are interchangeable for purposes here.

It will be further understood that various changes in the details, materials, and arrangements of the parts that have been described and illustrated in order to explain the nature of the described embodiments might be made by those skilled in the art without departing from the scope expressed in the following claims.

We claim:

1. A method of error correcting, by a media controller, user data stored in a solid-state media, the method comprising:
by the media controller:
receiving a read operation from a host device coupled to the media controller, the read operation corresponding to one or more given read units of the solid-state media;
reading data for the corresponding read units from the solid-state media employing initial values for one or more read threshold voltages;
determining if a disparity between an actual number of bits at a given logic level included in the read data and an expected number of bits at the given logic level included in the read data has reached a predetermined threshold;
only if the disparity has not reached the predetermined threshold:
decoding the read data; and
providing the decoded data to the host device;

wherein the user data has the expected number of bits at the given logic level when written to the solid-state media.

2. The method of claim 1, further comprising:
if the disparity has reached the predetermined threshold:
adjusting the one or more read threshold voltages of the solid-state media, based at least partly on the determined disparity;
re-reading data for the corresponding read units from the solid-state media employing the adjusted one or more read threshold voltages;
determining if the disparity between an actual number of bits at a given logic level included in the re-read data and the expected number of bits at the given logic level included in the re-read data has reached the predetermined threshold;
only if the disparity has not reached the predetermined threshold:
decoding the read data; and
providing the decoded data to the host device.

3. The method of claim 2, wherein the steps of adjusting the one or more read threshold voltages, re-reading data for the corresponding read units, and determining if the disparity between has reached the predetermined threshold are performed iteratively, until the disparity has not reached the predetermined threshold.

4. The method of claim 1, wherein the given logic level is at least one of: a logic 1 and a logic 0.

5. The method of claim 1, wherein data stored on the solid-state media is encoded by an encoder of the media controller such that each bit of the stored data has a substantially equal probability of being a logic 1 or a logic 0, thereby the expected number of bits at the given logic level in the read data is substantially 50% of the total read data.

6. The method of claim 5, further comprising:
determining the predetermined threshold according to a desired probability of the read data exceeding the predetermined threshold.

7. The method of claim 6, wherein the predetermined threshold comprises a disparity percentage from the expected number of bits at the given logic level.

8. The method of claim 5, wherein the desired probability is selected based on at least one of: a determined number of standard deviations from the expected number of bits at the given logic level; a probability of failure of the decoding step; a probability of miscorrecting read data; a predetermined uncorrectable bit error rate target; and an estimated or measured bit error rate.

9. The method of claim 1, wherein the step of decoding the read data comprises performing, by a low-density parity check decoder of the media controller, low-density parity check decoding on the read data, wherein the read data has a codeword length, n, where n is a positive integer, and wherein the read unit size corresponds to a page size of the solid-state media.

10. The method of claim 1 further comprising:
if the step of decoding the read data is unsuccessful:
iteratively, until the step of decoding the read data is successful:
adjusting the one or more read threshold voltages of the solid-state media, based at least partly on the determined disparity;
re-reading data for the corresponding read units from the solid-state media employing the adjusted one or more read threshold voltages; and
decoding the re-read data.

11. The method of claim 1, wherein, for the method, the solid-state media is a single-level cell NAND flash memory and the solid-state media employs a single read threshold voltage.

12. The method of claim 1, wherein, for the method, the solid-state media is a multi-level cell NAND flash memory and the solid-state media employs more than one read threshold voltage.

13. A non-transitory machine-readable medium, having encoded thereon program code, wherein, when the program code is executed by a machine, the machine implements a method of error correcting, by a media controller, user data stored in a solid-state media, the method comprising:
by the media controller:
receiving a read operation from a host device coupled to the media controller, the read operation corresponding to one or more given read units of the solid-state media;
reading data for the corresponding read units from the solid-state media employing initial values for one or more read threshold voltages;
determining if a disparity between an actual number of bits at a given logic level included in the read data and an expected number of bits at the given logic level included in the read data has reached a predetermined threshold;
only if the disparity has not reached the predetermined threshold:
decoding the read data; and
providing the decoded data to the host device;
wherein the user data has the expected number of bits at the given logic level when written to the solid-state media.

14. The non-transitory machine-readable medium of claim 13, further comprising:
if the disparity has reached the predetermined threshold:
adjusting the one or more read threshold voltages of the solid-state media, based at least partly on the determined disparity;
re-reading data for the corresponding read units from the solid-state media employing the adjusted one or more read threshold voltages;
determining if the disparity between an actual number of bits at a given logic level included in the re-read data and the expected number of bits at the given logic level included in the re-read data has reached the predetermined threshold;
only if the disparity has not reached the predetermined threshold:
decoding the read data; and
providing the decoded data to the host device.

15. The non-transitory machine-readable medium of claim 13, wherein the given logic level is at least one of: a logic 1 and a logic 0.

16. The non-transitory machine-readable medium of claim 13, wherein data stored on the solid-state media is encoded by an encoder of the media controller such that each bit of the stored data has a substantially equal probability of being a logic 1 or a logic 0, thereby the expected number of bits at the given logic level in the read data is substantially 50% of the total read data.

17. The non-transitory machine-readable medium of claim 16, further comprising:
determining the predetermined threshold according to a desired probability of the read data exceeding the predetermined threshold.

18. The non-transitory machine-readable medium of claim 13, wherein the step of decoding the read data comprises performing, by a low-density parity check decoder of the media controller, low-density parity check decoding on the read data.

19. The non-transitory machine-readable medium of claim 13 further comprising:
if the step of decoding the read data is unsuccessful:
iteratively, until the step of decoding the read data is successful:
adjusting the one or more read threshold voltages of the solid-state media, based at least partly on the determined disparity;
re-reading data for the corresponding read units from the solid-state media employing the adjusted one or more read threshold voltages; and
decoding the re-read data.

20. A media controller for error correcting data stored in a solid-state media coupled to the media controller, the media controller comprising:
an input/output interface configured to receive a read operation from a host device coupled to the media controller, the read operation corresponding to one or more given read units of the solid-state media;
a media interface configured to:
write data to the solid-state media, the data having an expected number of bits at a given logic level when written to the solid-state media; and
read the data for the corresponding read units from the solid-state media to a buffer, the media interface employing initial values for one or more read threshold voltages of the solid state media;
a control processor configured to determine if a disparity between an actual number of bits at the given logic level included in the read data and the expected number of bits at the given logic level included in the read data has reached a predetermined threshold;
a decoder configured to, only if the disparity has not reached the predetermined threshold:
decode the read data;
wherein the media controller is configured to provide the decoded data to the host device;
if the disparity has reached the predetermined threshold:
the media interface is configured to (i) adjust the one or more read threshold voltages of the solid-state media, based at least partly on the determined disparity, and (ii) re-read data for the corresponding read units from the solid-state media employing the adjusted one or more read threshold voltages.

* * * * *